United States Patent
Vafi et al.

(10) Patent No.: US 7,117,588 B2
(45) Date of Patent: Oct. 10, 2006

(54) METHOD FOR ASSEMBLING TILED DETECTORS FOR IONIZING RADIATION BASED IMAGE DETECTION

(75) Inventors: Habib Vafi, Brookfield, WI (US); David C. Neumann, Milwaukee, WI (US); Scott W. Petrick, Sussex, WI (US); Jeffrey A. Kautzer, Pewaukee, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 659 days.

(21) Appl. No.: 10/063,432

(22) Filed: Apr. 23, 2002

(65) Prior Publication Data

US 2003/0200655 A1    Oct. 30, 2003

(51) Int. Cl.
 *H05K 3/00* (2006.01)
(52) U.S. Cl. .............................. 29/829; 29/825; 29/830; 29/834; 250/370.09; 250/208.1
(58) Field of Classification Search ................ 29/829, 29/592.1, 840–843; 250/370.09, 208.1, 367–368, 250/361 R; 378/19, 4; 257/88
See application file for complete search history.

(56) References Cited

U.S. PATENT DOCUMENTS

| | | | | |
|---|---|---|---|---|
| 4,236,077 A | * | 11/1980 | Sonoda et al. | .......... 250/361 R |
| 5,055,681 A | * | 10/1991 | Tsuchino et al. | ........... 250/585 |
| 5,368,882 A | * | 11/1994 | Tran et al. | ..................... 427/65 |
| 6,392,143 B1 | * | 5/2002 | Koshio | ....................... 174/52.4 |
| 6,510,195 B1 | * | 1/2003 | Chappo et al. | ................ 378/19 |

* cited by examiner

*Primary Examiner*—Minh Trinh
(74) *Attorney, Agent, or Firm*—Fletcher Yoder (57) ABSTRACT

The present technique provides a multi-tile detector and a process for assembling the multi-tile detector using a flexible structure and intermediate electrical connections. The present technique minimizes edge gaps between adjacent detector tiles by coupling the detector tiles to the flexible structure and then flexing the flexible structure to close the edge gaps. Intermediate electrical connections, such as interlayer solder bumps, also may be used to minimize visible artifacts associated with tiling of the detector tiles. The present technique also may use a plurality of soldering materials having different melting temperatures to facilitate multiple soldering steps that are nondestructive of previous soldering steps.

17 Claims, 7 Drawing Sheets

METHOD FOR ASSEMBLING TILED DETECTORS FOR IONIZING RADIATION BASED IMAGE DETECTION

BACKGROUND OF THE INVENTION

The present invention relates generally to imaging systems, such as radiographic systems, and more particularly, to multi-tile detector assemblies used in such systems. Even more particularly, the present invention relates to a system and method for assembling detector tiles in a manner that minimizes or prevents visible artifacts associated with the tiling.

Medical diagnostic and imaging systems are ubiquitous in modern health care facilities. Currently, a number of modalities exist for medical diagnostic and imaging systems. These include computed tomography (CT) systems, x-ray systems (including both conventional and digital/digitized imaging systems), magnetic resonance (MR) systems, positron emission tomography (PET) systems, ultrasound systems, nuclear medicine systems, and so forth. Such systems provide invaluable tools for identifying, diagnosing and treating physical conditions and greatly reduce the need for surgical diagnostic intervention. In many instances, these modalities complement one another and offer the physician a range of techniques for imaging particular types of tissue, organs, physiological systems, and so forth.

Medical imaging systems often generate images by radiating a non-intrusive source into the patient and by reconstructing an image from the portion passing through the patient and impacting an imaging detector. In many imaging systems, the imaging detector may comprise a detector surface comprising a plurality of the detector tiles. For example, x-ray, computed tomography, positron emission tomography, nuclear, and gamma ray imaging detectors often use an ionizing photon detector material, such as Cadmium Zinc Telluride (CZT), Cadmium Telluride (CdTe), and various other crystalline semiconductor materials, which have size limitations due to a variety of production factors. For example, imaging detectors using the CZT material generally require multiple tiles, because CZT crystals can only be grown in relatively small sizes due to yield problems with current technology.

Accordingly, a plurality of CZT detector tiles are connected to a substrate, such as a silicon wafer or die, in a tiled arrangement to provide the desired size for the imaging detector. Unfortunately, the tiling process tends to create gaps that create visible artifacts in the reconstructed image. The assembly of detector tiles is also complicated by the need to connect the detector tiles electronically to their respective die, which then must be connected to the rest of the image receptor. Due to the nature of direct conversion detection of ionizing photons, an electrical connection is necessary between each detector tile and its respective die at each detection element and between each adjacent die (e.g., along at least one edge of each adjacent die). Moreover, an electrical connection is necessary between the metallized layers of each adjacent detector tile to provide the same voltage potential during imaging. The different coefficients of thermal expansion of the detector and wafer materials also complicate the foregoing electrical connections, because the temperature restraints for assembly further limit the assembly size of the detector tiles.

Accordingly, a technique is needed for assembling a plurality of detector tiles in a manner that minimizes or prevents visible artifacts associated with the tiling. In particular, a technique is needed for reducing gaps between adjacent detector tiles.

SUMMARY OF THE INVENTION

The present technique provides a multi-tile detector and a process for assembling the multi-tile detector using a flexible structure and intermediate electrical connections. The present technique minimizes edge gaps between adjacent detector tiles by coupling the detector tiles to the flexible structure and then flexing the flexible structure to close the edge gaps. Intermediate electrical connections, such as interlayer solder bumps, also may be positioned in order to minimize visible artifacts associated with tiling of the detector tiles. The present technique also may use a plurality of soldering materials having different melting temperatures to facilitate multiple soldering steps that are nondestructive of previous soldering steps.

In an aspect, the present technique provides a method for assembling tile detectors for an imaging system. The method involves bending a flexible panel to a curved shape and coupling a plurality of detector tiles to the flexible panel in the curved shape. The flexible panel is then inversely bent to a desired shape to close gaps between the detector tiles.

In another aspect, the present technique provides a method for assembling detector tiles for an imaging system. The method involves coupling a plurality of detector tiles to a flexible panel and bending the flexible panel to a desired curvature to close gaps between the detector tiles. The detector tiles are then fixed in the desired curvature.

In another aspect, the present technique provides a method for assembling an imaging structure. The method involves soldering a first element of the imaging structure using a first material and, then, subsequently soldering a second element of the imaging structure using a second material having a lower melting point than the first material.

In another aspect, the present technique provides a method for assembling detector tiles for an imaging system. The method involves placing a detector tile on a die, aligning a bump interconnect between the detector tile and the die, and electrically connecting the detector tile to the die using the bump interconnect.

In another aspect, the present technique provides a method for assembling detector tiles for an imaging system. The method involves disposing a plurality of detector modules on a substrate, each detector module comprising intermediate connections between a detector tile and a die. The method also involves aligning a plurality of bump interconnects and die vias at adjacent surfaces of each detector module and the substrate, each die via extending through the die. The method then proceeds to electrically connect each detector module to the substrate using the plurality of bump interconnects and vias.

In another aspect, the present technique provides a method for assembling detector tiles for an imaging system. The method involves overlapping edge portions of a plurality of detector modules at edge-based electrical connections at each adjacent module of the plurality of detector modules. The method also removes overlapping image data from one detector module of each overlapping pair of the detector modules.

BRIEF DESCRIPTION OF DRAWINGS

The foregoing and other advantages and features of the invention will become apparent upon reading the following detailed description and upon reference to the drawings in which.

DETAILED DESCRIPTION

As described in detail below, the present technique relates to assembly and connection processes for imaging detectors made with multiple tiles of crystalline semiconductor material, such as Cadmium Zinc Telluride (CZT). However, the processes and detector assemblies described below are applicable to a wide variety of imaging systems, detector structures, and detector materials. For example, the present techniques are applicable to a variety of wide-bandgap semiconductors that may be used in direct conversion detectors for ionizing radiation, including CZT, Cadmium Telluride (CdTe), and Silicon CMOS. These assembly and connection processes produce imaging detectors having a plurality of tightly packed tiles and internally interconnected imaging layers, which may include ionizing photon detection layers, circuitry layers, and mechanical support layers. As follows, an exemplary imaging system is described with reference to FIGS. 1–2, followed by a detailed description of the foregoing assembly and connection processes with reference to FIGS. 3–16.

Figure 1:
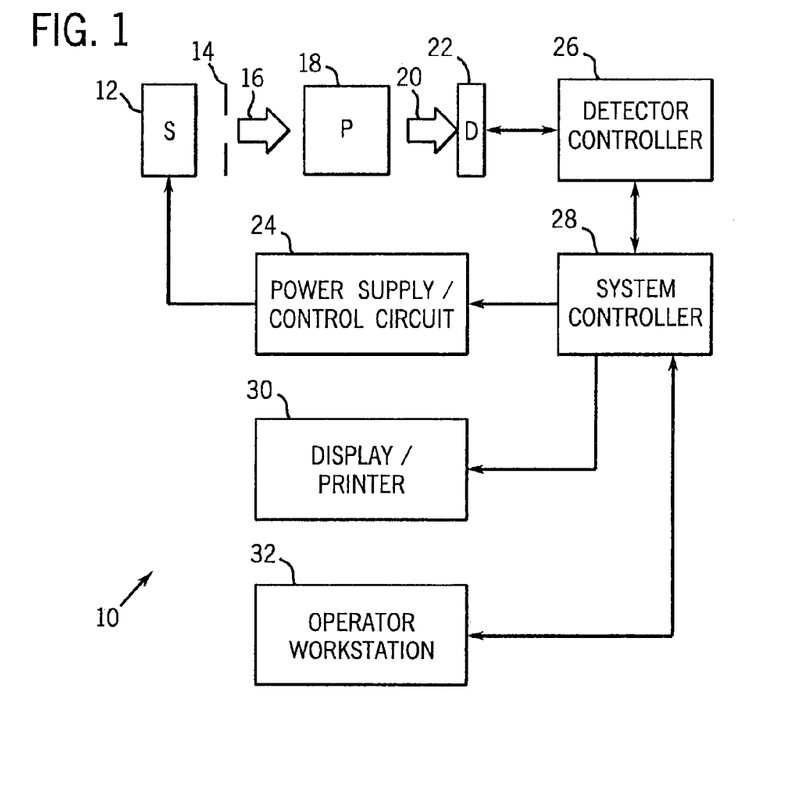
FIG. 1 is a diagrammatical overview of a digital X-ray imaging system in which the present technique may be utilized.

FIG. 1 illustrates diagrammatically an imaging system 10 for acquiring and processing discrete pixel image data. In the illustrated embodiment, system 10 is a digital X-ray system designed both to acquire original image data and to process the image data for display in accordance with the present technique. In the embodiment illustrated in FIG. 1, imaging system 10 includes a source of X-ray radiation 12 positioned adjacent to a collimator 14. Collimator 14 permits a stream of radiation 16 to pass into a region in which a subject, such as a human patient 18 is positioned. A portion of the radiation 20 passes through or around the subject and impacts a digital X-ray detector, represented generally at reference numeral 22. In this exemplary embodiment, the detector 22 is a direct conversion detector, in which the X-ray photons directly interact with the detector material (such as CZT) to elevate electron energies into the conduction band without the intermediate stage of visible-spectrum photons and photodiodes. However, the present is applicable to a wide variety of detectors and imaging systems.

Source 12 is controlled by a power supply/control circuit 24, which furnishes both power, and control signals for examination sequences. Moreover, detector 22 is connected to a detector controller 26, which commands acquisition of the signals generated in the detector 22. Detector controller 26 may also execute various signal processing and filtration functions, such as for initial adjustment of dynamic ranges, interleaving of digital image data, and so forth. Both power supply/control circuit 24 and detector controller 26 are responsive to signals from a system controller 28. In general, system controller 28 commands operation of the imaging system to execute examination protocols and to process acquired image data. In the present context, system controller 28 also includes signal processing circuitry, typically based upon a general purpose or application-specific digital computer, associated memory circuitry for storing programs and routines executed by the computer, as well as configuration parameters and image data, interface circuits, and so forth.

In the embodiment illustrated in FIG. 1, system controller 28 is linked to at least one output device, such as a display or printer as indicated at reference numeral 30. The output device may include standard or special purpose computer monitors and associated processing circuitry. One or more operator workstations 32 may be further linked in the system for outputting system parameters, requesting examinations, viewing images, and so forth. In general, displays, printers, workstations, and similar devices supplied within the system may be local to the data acquisition components, or may be remote from these components, such as elsewhere within an institution or hospital, or in an entirely different location, linked to the image acquisition system via one or more configurable networks, such as the Internet, virtual private networks, and so forth.

Figure 2:
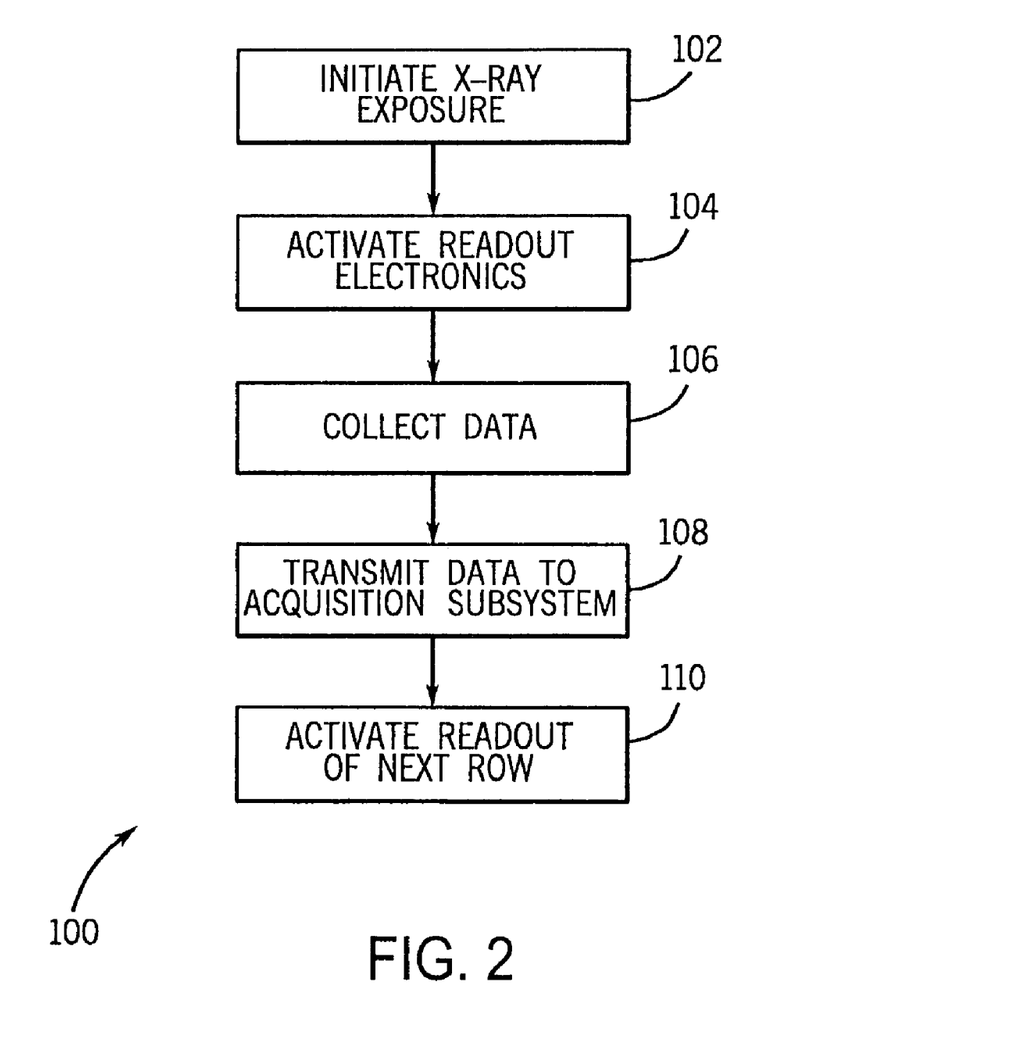
FIG. 2 is a flowchart representing a method of operating an exemplary imaging system for providing image data.

FIG. 2 is a flowchart illustrating a method 100 for operating an imaging system of the type described above. Initially, an X-ray exposure is initiated by an operator, as represented by step 102. Once an X-ray exposure is initiated, the readout electronics within the detector 22 are activated, as indicated by step 104. As mentioned above, an exposure is taken of a patient, whereby X-rays are transmitted through the patient and received by the detector. The array of pixels 86 typically measures the intensity of the X-rays received by the detector 22, via the readout electronics provided within each individual pixel. The readout electronics typically collect data utilizing circuitry associated with each of the pixels, as indicated by step 106. Once the data are collected, the data are transmitted to a data acquisition subsystem as indicated by step 108. Subsequently, the collected data are processed and ultimately used to reconstruct an image of the exposure area.

Figure 3:
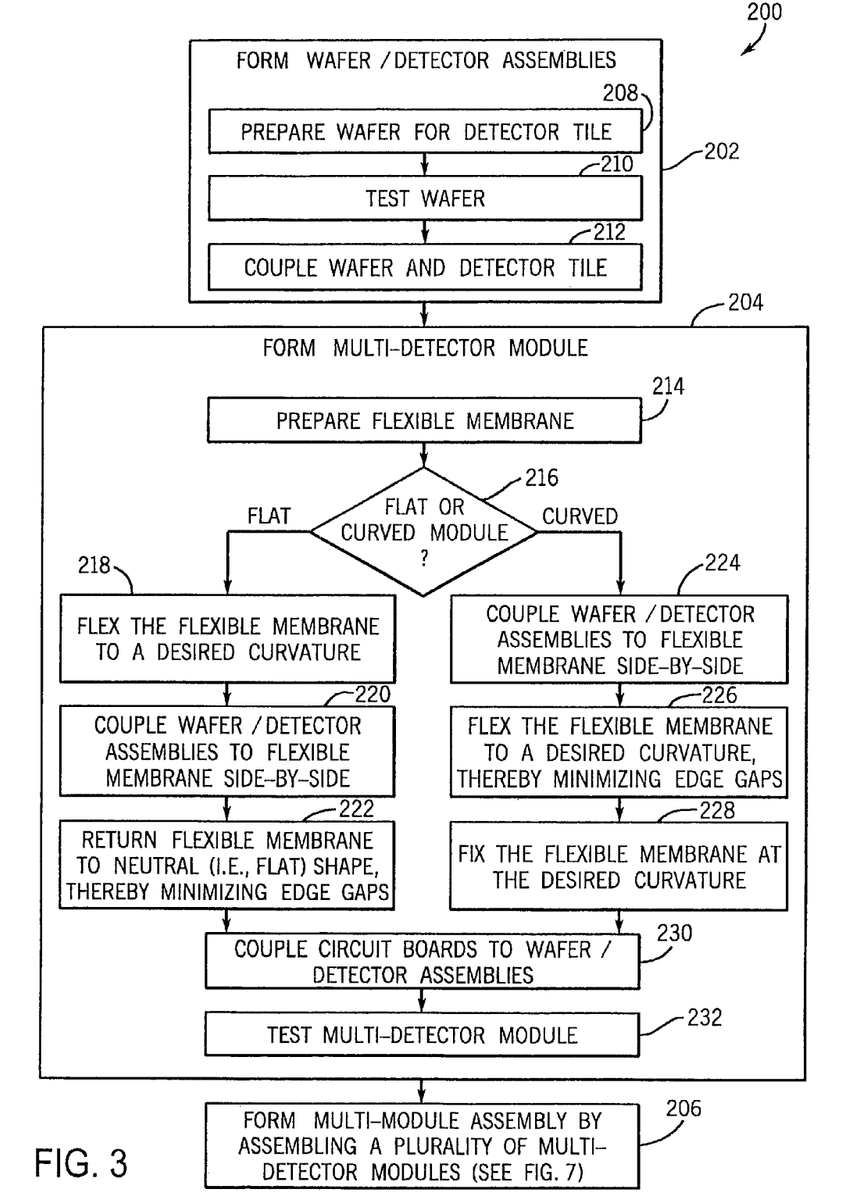
FIG. 3 is a flowchart illustrating an exemplary method of forming wafer/detector assemblies and multi-detector modules.
Figure 4:
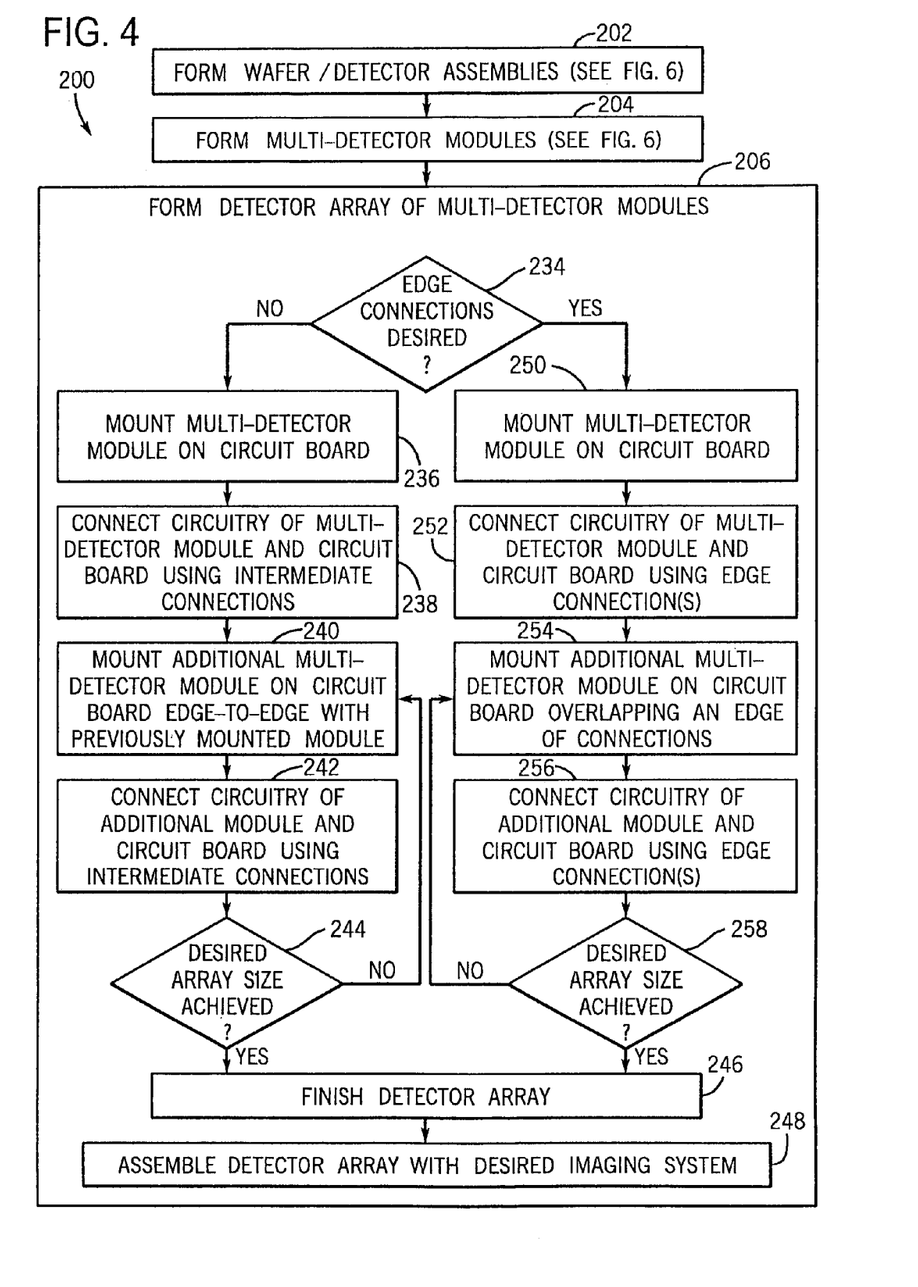
FIG. 4 is a flowchart illustrating an exemplary method of forming a multi-module assembly of the multi-detector modules produced by FIG. 3.

Turning now to the detector assembly and interconnection process, FIGS. 3–16 illustrate an exemplary process 200 for assembling and connecting a plurality of imaging tiles and layers for use in the forgoing imaging system 10. As illustrated in FIG. 3, the process 200 proceeds by forming a plurality of wafer/detector assemblies, forming a plurality of multi-detector modules using the wafer/detector assemblies and individual circuit boards, and forming a multi-module assembly by coupling a plurality of the multi-detector modules to a main circuit board, as indicated by blocks 202, 204, and 206, respectively. The former two assembly blocks 202 and 204 are illustrated in FIG. 3, while the latter assembly block 206 is illustrated in FIG. 4. In the wafer/detector assembly block 202, the process 200 proceeds by preparing a wafer/die for assembly with a detector tile (block 208). The wafer/die may be produced from silicon or other suitable materials using conventional wafer production methods. However, the process 200 creates vias through the wafer/die to facilitate electrical connections through the wafer/die between the detector tile and circuitry on opposite sides of the wafer/die. In via regions, the process 200 thins the wafer as thin as practical (e.g., 100 microns or thinner) to facilitate the through-connections. The vias provide electrical connections for each detector element and for power and control. The power and control vias are located in available areas between detector elements, thereby eliminating or minimizing the need for edge areas outside the image reception areas, as described in further detail below. The process 200 then proceeds to test the wafer and to harvest known good areas by means of damage free dicing, which combines mechanical sawing with Atmospheric Downstream Plasma (ADP) etching (block 210).

The wafer/detector assembly block 202 then proceeds to connect each good wafer to a detector tile (block 212). In this exemplary embodiment, the detector tile is bump-array soldered to each good wafer using an adhesive, such as a solder having a relatively higher melting temperature than that used for subsequent adhesion/soldering steps. The solder bumps (e.g., micro bumps or stubs) may be formed on one or both connection surfaces of the detector tile and the wafer by evaporation, printing, plating, or any other suitable technique. The assembly block 212 then electrically connects the detector tile and the wafer using reflow soldering, Anisotropic Conductive Film (ACF) or paste, ultraviolet curing resin or hot gas, or any other suitable technique. For example, a CZT detector tile, with its top metallization layer already applied, may be electrically connected to a silicon die using an array of high-temperature solder bumps (i.e., relatively higher temperature solder than subsequent solder steps) disposed in the desired locations for electrical interconnections. The process 200 then tests these wafer/detector assemblies and repairs or discards unacceptable assemblies.

The detector tiles used in the forgoing wafer/detector assemblies may embody any suitable imaging detector materials and structures. For example, the detector tiles may embody a Cadmium Zinc Telluride (CZT) tile, which has a metallization layer applied to its input surface (i.e. side facing a photon or other imaging source). The thickness and composition of the detector tiles may vary depending on the radiation spectrum and dose rates appropriate for the specific detector's clinical application. For example, present technology puts a lower limit of approximately 0.5 mm on the thickness of CZT crystals, while a typical CZT crystal thickness is approximately 3 mm. Present technology also limits the planar size of suitable quality CZT crystals to dimensions on the order of a few centimeters. However, any suitable detector tiles, materials, and dimensions are within the scope of the present technique.

As indicated by block 204, the process 200 then proceeds to form a plurality of multi-detector modules, each of which embodies one of the wafer/detector assemblies and an individual circuit board. In this exemplary assembly block 204, the process 200 uses a flexible membrane to tile a plurality of the wafer/detector assemblies in a tightly packed arrangement, which is then connected to the individual circuit boards. Accordingly, the assembly block 204 proceeds by preparing a flexible membrane large enough to support a desired number of the wafer/detector assemblies (block 214). For example, the assembly block 214 may fabricate the flexible membrane by depositing a thin layer of polyimide (PI) or another suitable flexible material onto a silicon or aluminum wafer. If the flexible membrane is desired in the final assembly, then the assembly block 214 may metallize the thin flexible layer to facilitate interconnection between the metallization layers of the detector tiles. The assembly block 214 then proceeds to remove an inner perimeter portion of the wafer connected to the flexible membrane, thereby forming a wafer frame around the perimeter of the flexible membrane. For example, the assembly block 214 may mask a frame out of the silicon or aluminum wafer using etch-resist masking, which leaves a wafer frame supporting the flexible membrane. The assembly block 214 then applies an adhesion promotion layer to the flexible membrane on the tile-mounting-side of the flexible membrane.

The assembly block 204 then proceeds to form the multi-detector module by mounting a plurality of the wafer/detector assemblies (tiles) to a circuit board in a flat or curved configuration, which depends on the desired application (block 216). If a flat configuration is desired at block 216, then the assembly block 204 proceeds to flex the flexible membrane to a desired curvature (block 218). For example, the assembly block 218 may apply different gas pressures to opposite sides of the flexible membrane, or gas pressure on one side with vacuum on the other side, causing the flexible membrane to assume the desired curvature (i.e., convex toward the lower pressure side and concave toward the higher pressure side). In this curved configuration, the wafer frame constrains the edges and supports the flexible membrane. Alternatively, the assembly block 218 may apply a liquid, a gel, or another suitable fluid to one or both sides of the flexible membrane to provide the desired curvature. The assembly block 218 also may press as the flexible membrane against a curved solid structure to shape the flexible membrane in the desired curvature.

After using one of these curvature-inducing techniques, the assembly block 204 proceeds to place a plurality of the wafer/detector assemblies (tiles) onto the flexible membrane in a side-by-side or tiled configuration (block 220). For example, the assembly block 220 may pick and place CZT tiles with attached silicon dice on the flexible membrane with the CZT metallization layers facing against the flexible membrane. The present capability of pick and place technology produces approximately 10 to 12 micron accuracy at a quality level of approximately 3 Sigma. The plurality of wafer/detector assemblies are secured to the flexible membrane via the adhesive layer on the flexible membrane. The assembly block 204 then proceeds to return the flexible membrane to a neutral/flat shape, thereby closing any gaps between adjacent wafer/detector assemblies (block 222). For example, the assembly block 222 may remove gas pressures, fluid pressures, or curved solid structures slowly away from the flexible membrane to force adjacent tiles (i.e., the wafer/detector assemblies) toward each other in a relatively tightly packed arrangement. Alternatively, the assembly block 222 may flex/return the flexible membrane to another curvature desired for the final assembly. Accordingly, assembly block 222 may be used to provide either a flat or a curved geometry for the multi-detector module.

Turning back to block 216, if a curved detector assembly is desired, then the assembly block 204 proceeds to connect a plurality of the wafer/detector assemblies (tiles) to the flexible membrane in a side-by-side or tiled configuration (block 224). For example, the assembly block 224 may pick and place CZT tiles with attached silicon dice on the flexible membrane with the CZT metallization layers facing against the flexible membrane. The wafer/detector assemblies are secured to the flexible membrane via the adhesive layer on the flexible membrane. The assembly block 204 then proceeds to flex the flexible membrane to a desired curvature, thereby closing any gaps between adjacent wafer/detector assemblies (block 226). For example, the assembly block 226 may apply gas pressures, fluid pressures, or curved solid structures slowly against one or both sides of the flexible membrane and attached wafer/detector assemblies to force adjacent tiles (i.e., the wafer/detector assemblies) toward each other in a relatively tightly packed arrangement. The flexible membrane and attached wafer/detector assemblies are then fixed at the desired curvature (block 228).

In either the curved or the flat configuration, the assembly block 204 then proceeds to connect individual circuit boards to the plurality of wafer/detector assemblies that are positionally secured by the flexible membrane (block 230). The product of assembly block 230 is a multi-detector module comprising multiple wafer/detector assemblies (tiles) connected to the individual circuit board. The assembly block 230 also may remove the flexible membrane from multi-detector module, as discussed above. In this exemplary embodiment, the assembly block 230 solders the individual circuit boards to the wafer side of each group of wafer/detector assemblies. After the assembly block 230 has formed the desired electrical connections, the assembly block 204 proceeds to test the multi-detector module for defects and to repair defective modules if repairable (block 232).

As discussed above with reference to assembly block 212, the assembly block 230 may perform the soldering using a linear bump-array of solder pads that are reflowed to form a linear array or matrix pattern of electrical connections between the individual circuit boards and the wafer/detector assemblies. The vias also facilitate electrical connections between opposite sides of the wafer as the solder bump-arrays are reflowed on the detector tile side and the circuit board side of the wafer/detector assemblies. If connections are desired along edges of the wafer/detector assemblies, then the assembly block 230 connects edges of the wafers/detector assemblies with the circuit board using either wire bonding or a linear bump array of solder pads. Moreover, the assembly block 230 may use a relatively lower temperature solder than that used by the assembly block 212 to avoid disturbing or destroying the electrical connections created between the wafer and detector tile. This multi-temperature soldering process is particularly advantageous for assemblies in which the first and second soldering steps cannot be performed simultaneously and identical temperatures would otherwise destroy the results of the first soldering step during second soldering step. The result of the foregoing assembly and connection techniques is a tightly packed multi-detector module.

If the foregoing multi-detector module provides the full dimensions desired for imaging detection, then the multi-detector module may be connected to a primary printed circuit board using flex connector, pin arrays, or any other suitable connection assembly. However, if a plurality of the multi-detector modules are required to form the full dimensions desired for imaging detection, then the process 200 proceeds to form a multi-module assembly by assembling a plurality of the multi-detector modules formed by the assembly blocks 202 and 204, as illustrated by block 206 and FIG. 4. As illustrated by FIG. 4, the assembly block 206 proceeds by querying the type of edge connections desired for the detector array of multi-detector modules (block 234). For example, the solder bump-arrays and vias disposed in portions of the multi-detector modules may reduce or eliminate the need for edge connections, such as power and control connections.

If the query block 234 determines that edge connections are undesired or unnecessary, then the assembly block 206 proceeds to mount a multi-detector module onto the primary circuit board (block 236). The assembly block 206 then proceeds to connect circuitry of the multi-detector module and the primary circuit board using intermediate connections (i.e., interperimeter/interlayer connections), such as provided by vias and solder bump-arrays (block 238). The assembly block 206 then mounts additional multi-detector modules onto the primary circuit board edge-to-edge with the previously mounted multi-detector module (block 240). The assembly block 206 then connects circuitry of the additional multi-detector module and the primary circuit board using intermediate connections, such as provided by vias and solder bump arrays (block 242). At query block 244, the assembly block 206 evaluates the present size of the multi-module assembly of multi-detector modules. If the multi-module assembly does not have the desired imaging dimensions, then the assembly block 206 returns to assembly block 240 to mount an additional multi-detector module to the primary circuit board. The foregoing process 200 continues to loop through blocks 240 and 242 until the multi-module assembly has the desired dimensions at block 244. If the multi-module assembly has the desired imaging dimensions, then the assembly block 206 proceeds to finish the detector array (block 246). The multi-module assembly is then assembled with a desired imaging system, such as an X-Ray, CT, PET, Nuclear, or Gamma Ray imaging system (block 248).

In the foregoing assembly blocks 236 through 242, the absence of edge connections facilitates direct edge-butting of adjacent multi-detector modules, thereby eliminating the need to shingle or overlap the adjacent modules to ensure full coverage at the module edges. The foregoing edge-to-edge mounting configuration of the modules also eliminates elevational variations of the multi-detector modules. Instead, the inner perimeter connections (e.g., connections using vias and solder bump-arrays) provide a simple flat plane and tiled arrangement of the multi-detector modules. Accordingly, an exemplary embodiment of the present technique forms all power and control connections within the boundaries of the pixel connection array (i.e., between the detector tiles and the wafer) by forming these connections in areas between the pixel connections, rather than routing them to one or more edges for connection with the primary circuit board.

If the query block 234 determines that edge connections are desired or necessary, then the assembly block 206 proceeds to mount a multi-detector module onto the primary circuit board (block 250). The assembly block 206 then proceeds to connect circuitry of the multi-detector module and the primary circuit board using edge connections, such as provided by pins, flexibly leads, wires, edge-based solder bump-arrays, or other edge connectors (block 252). The assembly block 206 then mounts additional multi-detector modules on the primary circuit board overlapping (or shingling) the edge connection(s) of the previously mounted multi-detector module (block 254). The assembly block 206 then connects circuitry of the additional multi-detector module and the primary circuit board using edge connections, such as provided by pins, flexibly leads, wires, edge-based solder bump-arrays, or other edge connectors (block 256). At query block 258, the assembly block 206 evaluates the present size of the multi-module assembly of multi-detector modules. If the multi-module assembly does not have the desired imaging dimensions, then the assembly block 206 returns to assembly block 254 to mount an additional multi-detector module to the primary circuit board in an overlapping or shingled arrangement. The foregoing process 200 continues to loop through blocks 254 and 256 until the multi-module assembly has the desired dimensions at block 258. If the multi-module assembly has the desired imaging dimensions, then the assembly block 206 proceeds to finish the detector array (block 246). The multi-module assembly is then with a desired imaging system, such as an X-Ray, CT, PET, Nuclear, or Gamma Ray imaging system (block 248).

In the foregoing edge-connected and overlapped assembly of multi-detector modules, the individual multi-detector modules may have one or more edges connected to the primary circuit board. If a single edge of connections is needed from the individual multi-detector modules, then the foregoing assembly blocks 250 through 256 begin as a double column of the multi-detector modules. For example, the assembly blocks 202 and 204 of FIG. 3 may be used to create a tightly packed dual-column of the wafer/detector assemblies. The process 200 then proceeds to attach successive single columns of the multi-detector assemblies on each side of the dual column, with each successive single column overlapping the connection edge of previously mounted column. This overlapping, or shingling, arrangement of the adjacent columns ensures full coverage of the image reception area with pixels. If two edges of connections are needed from the individual multi-detector modules, then the overall multi-module assembly may be assembled using a rectangular or square checkerboard array of the multi-detector modules. For example, the multi-detector modules may be mounted in alternating high and low elevations to overlap multiple edges of the multi-detector modules.

For CT, PET, and other imaging systems benefiting from an arc-shaped detector assembly, the process 200 may assemble the multi-module assembly by angling adjacent multi-detector modules or by building curvature into the multi-detector modules, as described above. For example, an arc-shaped multi-detector module may be formed in assembly blocks 218 through 222 by overflexing the flexible membrane, attaching the multi-detector modules, and returning the flexible membrane to the desired curvature. Alternatively, the arc-shaped multi-detector module may be formed in assembly blocks 224 through 228 by attaching the multi-detector modules to the flexible membrane, flexing the membrane to the desired curvature, and fixing the assembly in the desired curvature. In either assembly process, the flexing creates an edge-butting force between adjacent multi-detector modules that minimizes or eliminates gaps between the adjacent modules. As noted above, the arc-shaped detector assembly also may use the foregoing shingling technique of overlapping edges of adjacent multi-detector modules. For example, an arc-shaped multi-module assembly may be formed by shingling/overlapping each multi-detector module at an angle relative to an adjacent multi-detector module, rather than a constant angle relative to the primary circuit board.

Figure 5:
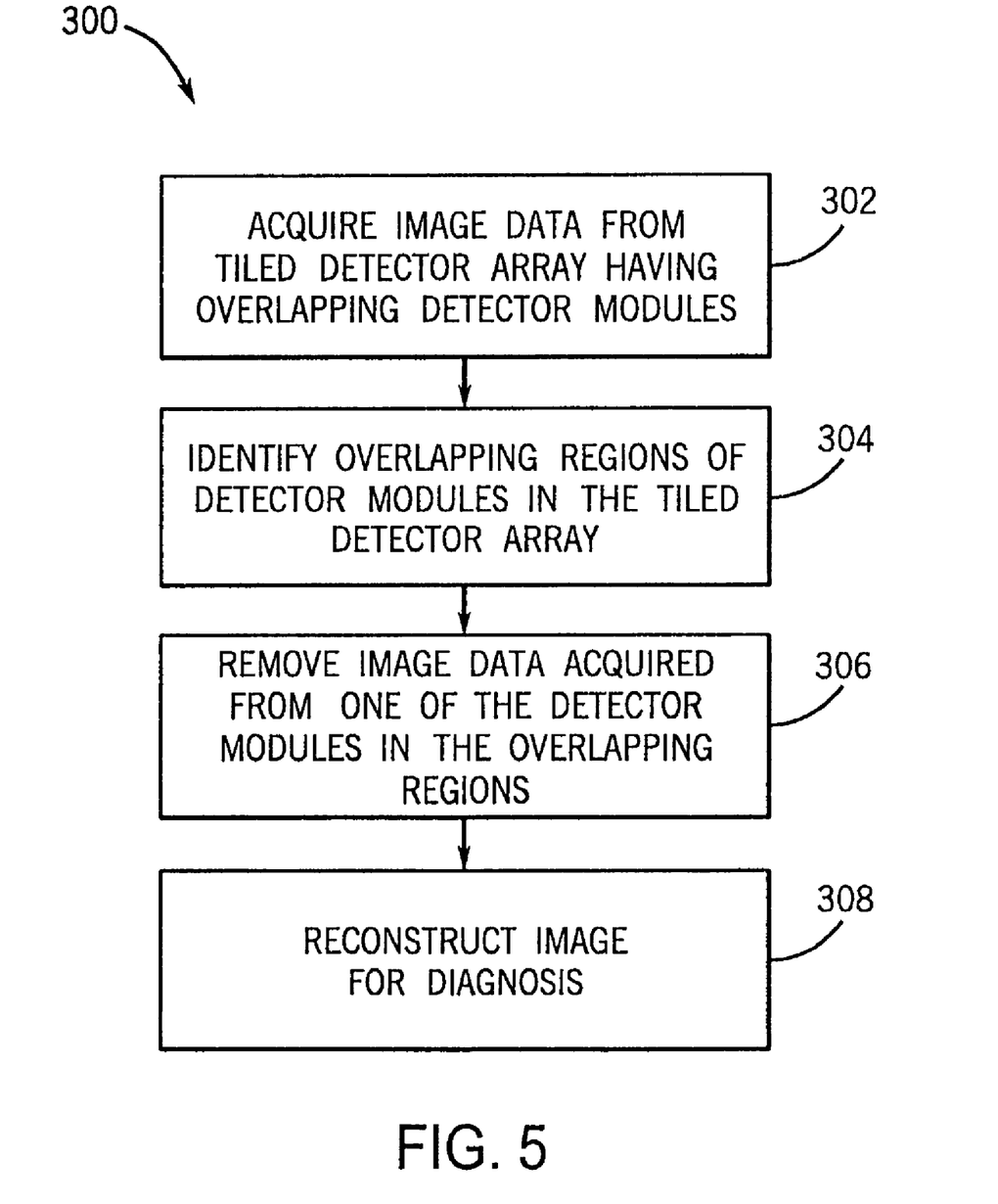
FIG. 5 is a flowchart illustrating an exemplary method of reconstructing an image using image data acquired from a tiled detector array having overlapping detector modules.

If the foregoing overlapping/shingling techniques are used to assemble the multi-module assembly, then the present technique may utilize an image reconstruction algorithm to correct for the overlapping portions of the multi-detector modules. FIG. 5 illustrates an imaging process 300 utilizing such an image correction algorithm. As illustrated, the imaging process 300 proceeds by acquiring image data from a tiled detector array having overlapping detector modules, such as the shingled/overlapping detector assembly described above (block 302). The imaging process 300 then identifies overlapping regions of adjacent detector modules in the tiled detector array (block 304). For example, the imaging process 300 may identify pixels falling entirely or partially within the shadow of the primary pixel receptors in a plane above the shadowed pixels. The imaging process 300 then proceeds to remove image data acquired from one of the detector modules in the identified overlapping regions (block 306). For example, the foregoing identification and removal blocks 304 and 306 may detect signal levels in a calibrated image, identify overlapping image signals, and remove image pixel data corresponding to one of those overlapping image signal areas prior to presentation of the image for diagnosis. The imaging process 300 also may retain all or part of the shadowed pixels and combine these pixels with other retained image pixel data, such as pixels in non-overlapping regions. For example, if pixels are partially shadowed, then the partially shadowed image pixel data may be retained and combined with adjacent retained image pixel data. The imaging process 300 also may perform a variety of pixel alignment, matching, and orientation operations on the image data. For example, the foregoing tiling may require alignment or orientation of image pixels to account for alignment variations due to the overlapping detector tiles.

Figure 9:
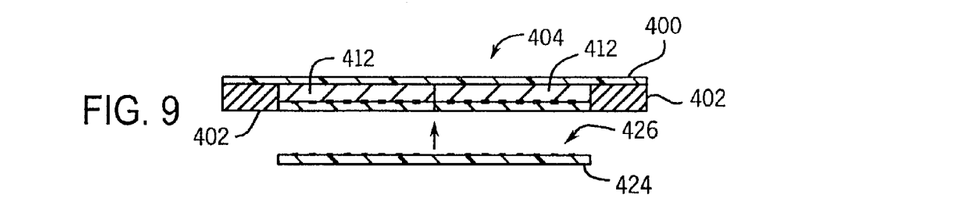
FIG. 9 is a cross-sectional view illustrating the flexible structure relaxed to a flat configuration, whereby an edge gap between the pair of wafer/detector assemblies is reduced or minimized.
Figure 10:
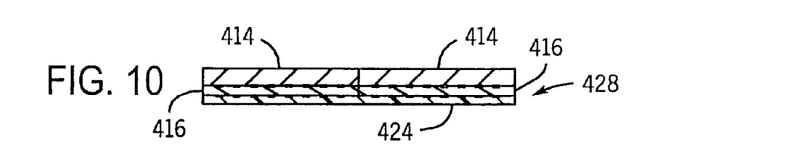
FIG. 10 is a cross-sectional view illustrating an exemplary multi-detector module having intermediate connections between the multiple detector tiles, the multiple wafers, and the circuit board.
Figure 11:
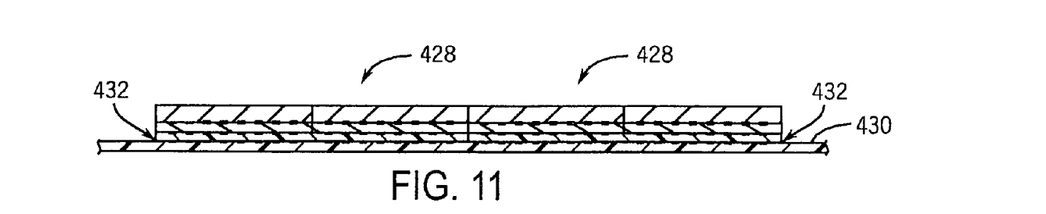
FIG. 11 is a cross-sectional view illustrating an exemplary multi-module assembly of the foregoing multi-detector modules disposed on a primary circuit board in an edge-to-edge configuration.
Figure 13:
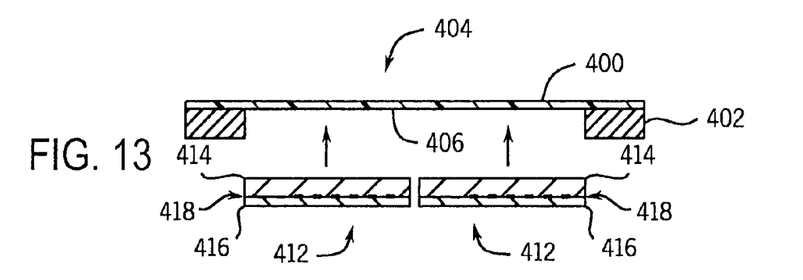
FIG. 13 is a cross-sectional view illustrating a pair of the wafer/detector assemblies being mounted to the flexible structure in a flat configuration.
Figure 14:
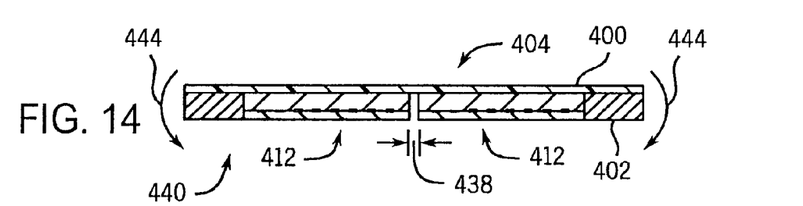
FIG. 14 is a cross-sectional view illustrating an edge gap between the pair of wafer/detector assemblies mounted to the flexible structure.
Figure 15:
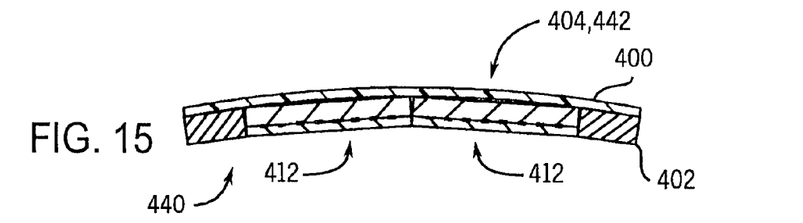
FIG. 15 is a cross-sectional view illustrating the flexible structure in a curved configuration, whereby the edge gap is reduced or minimized.
Figure 16:
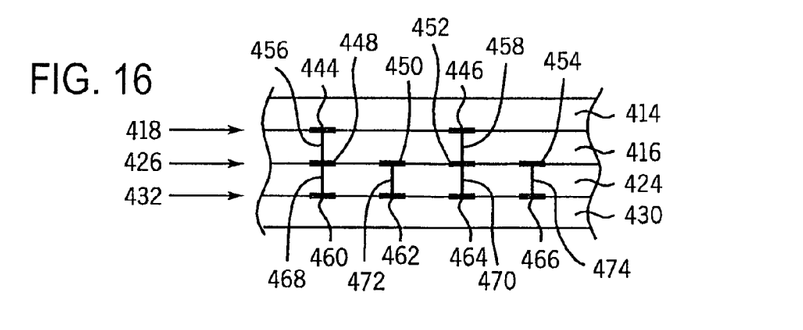
FIG. 16 is a cross-sectional view illustrating exemplary intermediate connections between various imaging detector layers, such as illustrated by FIGS. 6–15.

Turning now to exemplary embodiments corresponding to the foregoing assembly process 200, FIGS. 6–16 illustrate the step-by-step assembly of the wafer/detector assemblies, the multi-detector modules, and the multi-module assemblies referenced above in the FIGS. 3–5. As illustrated, FIGS. 6–10 illustrate the step-by-step assembly of the multi-detector module formed by assembly blocks 218–222 of the assembly block 204. FIG. 11 illustrates the intermediately interconnected multi-detector module formed by assembly blocks 236–244 of the assembly block 206. FIG. 13 illustrates the edge-connected and shingled multi-detector module formed by assembly blocks 250–258 of the assembly block 206. FIGS. 13–15 illustrate the step-by-step assembly of the arc-shaped multi-detector module formed by assembly blocks 224–228 of the assembly block 204. FIG. 16 illustrates exemplary electrical interconnections between various layers of the foregoing detector modules and assemblies.

Figure 6:
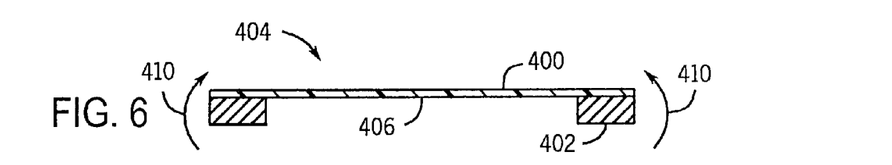
FIG. 6 is a cross-sectional view of an exemplary flexible structure for assembling a plurality of the wafer/detector assemblies.

As illustrated in FIG. 6, a flexible membrane 400 is connected to a wafer 402, which is formed into a frame around the perimeter of the flexible membrane 400. For example, a framed flexible structure 404 may be formed by depositing a polyimide or other flexible materials 400 onto a silicone or aluminum wafer 402. An adhesion promotion layer, such as adhesive layer 406, also may be applied to the flexible membrane 400 on a mounting side of the framed flexible structure 404. The framed flexible structure 404 is then flexed into an arc-shaped structure 408, as indicated by arrows 410. For example, one or more gases, fluids, or solids may be applied to one or both sides of the structure 404 to bend the flexible membrane 404 into the arc-shaped structure 408.

Figure 7:
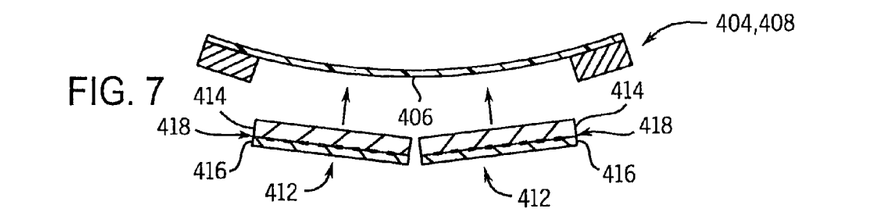
FIG. 7 is a cross-sectional view illustrating the flexible structure in a curved configuration.

As illustrated by FIG. 7, a plurality of wafer/detector assemblies 412 are then secured to the arc-shaped structure 408 via the adhesive layer 406. For example, as described above, pick and place techniques may be used to orient and place the wafer/detector assemblies 412 onto the adhesive layer 406 in an edge-to-edge or tiled arrangement. Each wafer/detector assembly 412 comprises a detector tile 414 connected to a die 416, which may be assembled according to assembly block 202 of FIG. 3. For example, each detector tile 414 may be electrically connected to its respective die 416 via intermediate connections 418, which may comprise solder bump-arrays, vias, or other suitable intermediate connection structures.

Figure 8:
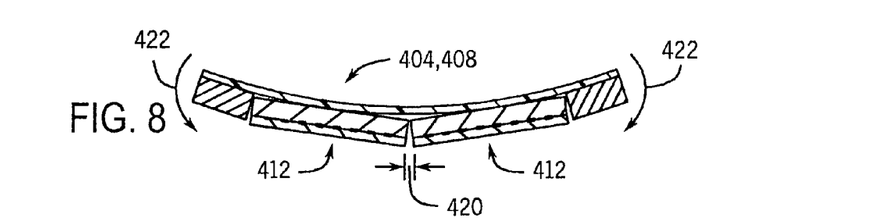
FIG. 8 is a cross-sectional view illustrating a pair of the wafer/detector assemblies mounted to the flexible structure in the curved configuration.

As illustrated by FIG. 8, the plurality of wafer/detector assemblies 412 are adhered to the arc-shaped structure 408 in an edge-to-edge or tiled arrangement, which may leave a gap 420 between adjacent wafer/detector assemblies 412. For example, existing pick and place technology may produce a tile placement accuracy of approximately 10 to 12 microns at a quality level of approximately 3 sigma. After adhering the plurality of wafer/detector assemblies 412 to the arc-shaped structure 408, the gap 420 is reduced or eliminated by flexing the arc-shaped structure 408 back toward a flat shape, as indicated by arrows 422. For example, any gas pressure, fluid pressure, or solid structure may be removed slowly from one or both sides of the arc-shaped structure 408 until the flexible membrane 400 flexes back toward the desired curvature, such as the flat shape illustrated by FIG. 9.

As illustrated by FIG. 9, the reverse bending 422 of the flexible membrane 400 minimizes (or eliminates) the gap 420. A circuit board 424 may then be connected to the plurality of wafer/detector assemblies 412 via intermediate connections 426, which may comprise a solder bump-array along the surface of the circuit board 424 and vias extending through the dice 416 of the wafer/detector assemblies 412. In this exemplary embodiment, the intermediate connections 426 comprise a solder material having a relatively lower melting temperature than that of the intermediate connections 418. Accordingly, the present technique intermediately connects the circuit board 424 to the dice 416 (opposite the detector tiles 414) without disturbing or destroying the intermediate connections 418 between the detector tiles 414 and the dice 416.

FIG. 10 illustrates an exemplary multi-detector module 428 formed by the step-by-step assembly process of FIGS. 6–9. As illustrated, the flexible membrane 400 and the wafer 402 have been removed from the plurality of wafer/detector assemblies 412 connected to the circuit board 424. However, as discussed above, the flexible membrane 400 may remain connected to the wafer/detector assemblies 412 if the membrane 400 is metallized to provide interconnections between the adjacent detector tiles 414. As discussed above and illustrated in further detail by FIG. 16, one or more vias may extend through the dice 416 and the circuit board 424 to provide pixel, power, and control interconnections among the various layers of the detector assembly. The result of these intermediate connections, and the foregoing assembly process 200, is a tightly packed tiled-arrangement of the detector tiles 414.

If the foregoing multi-detector module 428 provides the full dimensions desired for imaging detection, then the multi-detector module 428 may be connected to a primary printed circuit board using flex connectors, pin arrays, or another suitable connection assembly. However, if the foregoing multi-detector module 428 does not fully provide the desired dimensions for imaging detection, then a plurality of the multi-detector modules 428 may be tiled edge-to-edge or in an overlapped/shingled arrangement onto a primary circuit board 430. The result is a multi-module assembly (or full size detector structure) comprising a plurality of the foregoing multi-detector modules 428, as illustrated by FIGS. 11 and 12.

If edge connections are undesirable or unnecessary for the individual multi-detector modules 428, then multi-detector modules 428 may be tiled edge-to-edge as illustrated by FIG. 11. In this exemplary embodiment, each individual multi-detector module 428 may be connected to the primary circuit board 430 via intermediate connections 432, which may comprise a solder bump-array along the surface of the primary circuit board 430 and vias extending through various layers of the multi-detector modules 428. The intermediate connections 418, 426, and 432 are illustrated in further detail below with reference to FIG. 16. These intermediate connections advantageously provide a relatively tightly packed tiling arrangement, which reduces visible artifacts in the image due to the tiling.

Figure 12:
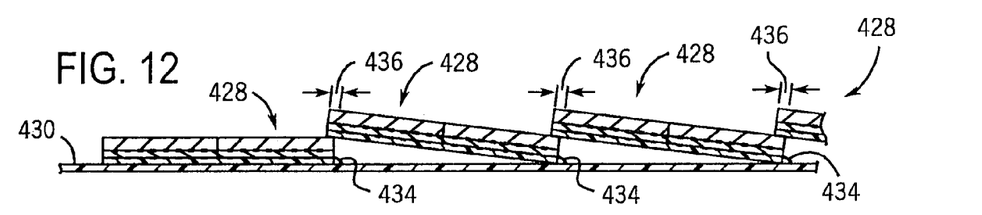
FIG. 12 is a cross-sectional view illustrating an alternate multi-module assembly of the foregoing multi-detector modules disposed on a primary circuit board in an overlapping configuration.

If edge connections are desired or necessary for the individual multi-detector modules 428, then multi-detector modules 428 may be connected to the primary circuit board 430 in an overlapping/shingled configuration, as illustrated by FIG. 12. In this exemplary embodiment, each individual multi-detector module 428 may be connected to the primary circuit board 430 via edge connections 434, which may comprise pins, flexible connectors, wires, or a solder bump-array along one or more edges of each multi-detector module. Accordingly, each adjacent multi-detector module 428 overlaps an edge portion 436 of the multi-detector module 428 having the edge connections 434. If two edge connections are necessary, then the plurality of multi-detector modules 428 may be shingled alternatingly high and low to overlap the edge connections 434 on opposite ends of the adjacent multi-detector modules 428. As described in detail above, an image correction algorithm also may be used to correct for the overlapped edge portions 436.

As discussed above with reference to assembly blocks 224–228 of FIG. 3, the foregoing multi-detector module and multi-module assembly also may be formed in a curved or arced shape. FIGS. 13–15 illustrate an exemplary step-by-step structural assembly of such an arc-shaped multi-detector module formed by assembly blocks 224–228. As illustrated in FIG. 13, a plurality of the wafer/detector assemblies 412 are secured to the framed flexible structure 404 via the adhesive layer 406. For example, as described above, pick and place techniques may be used to orient and place the wafer/detector assemblies 412 onto the adhesive layer 406 in an edge-to-edge or tiled arrangement.

However, as discussed above, existing pick and place technology may produce an unacceptable tile placement accuracy that results in a significant gap 438 between adjacent wafer/detector assemblies 412, as illustrated by assembled multi-detector module 440 of FIG. 14. The present technique minimizes or eliminates the gap(s) 438 by flexing, or bending, the framed flexible structure 404 into an arc-shaped structure 442, as indicated by arrows 444. For example, one or more gases, fluids, or solids may be applied to one or both sides of the structure 404 to bend the framed flexible structure 404 into the arc-shaped structure 442.

In this arc-shaped detector application, the present technique then fixes the multi-detector module 440 in the arced-shape 442, as illustrated by FIG. 15. For example, the multi-detector module 440 may be fixed in the arced-shape 442 by intercoupling the plurality of wafer/detector assemblies 412 to one or more flexible circuit boards or other support structures via suitable intermediate or edge connections. Again, these connections may comprise a solder material having a relatively lower melting temperature than that of the intermediate connections 418 between the detector tiles 414 and the dice 416 of the wafer/detector assemblies 412. Accordingly, the present technique fixes the arced-shape without disturbing or destroying the previously formed intermediate connections 418.

If the foregoing multi-detector module 440 provides the full dimensions desired for imaging detection, then the multi-detector module 440 may be connected to a primary printed circuit board using flex connectors, pin arrays, or another desired connection assembly. However, if the foregoing multi-detector module 440 does not fully provide the desired dimensions for imaging detection, then a plurality of the multi-detector modules 440 may be tiled edge-to-edge or in an overlapped/shingled arrangement onto a primary circuit board, as discussed above. The result is an arced/curved multi-module assembly (or full size detector structure) comprising a plurality of the foregoing multi-detector modules 440, as illustrated by FIGS. 13–15.

In the detector assemblies illustrated by FIGS. 6–15, one or more intermediate connections may be used to facilitate edge-to-edge tiling and to provide a relatively integral and tightly packed tile configuration. FIG. 16 is a partial cross-sectional view of an image detector structure, such as the multi-module assemblies of FIGS. 11 and 12, illustrating exemplary intermediate connections between the imaging detector layers. For example, the imaging detector layers may embody the detector tiles 414, the dice 416, the circuit board 424, and the primary circuit board 430.

These imaging detector layers 414, 416, 424, and 430 are interconnected via the intermediate connections 418, 426, and 432, respectively. As illustrated, the intermediate connections 418, 426, and 432 comprise a variety of connector pads and vias extending through the various imaging detector layers. For example, the detector tile 414 may be connected to the die 416 via a plurality of solder bump-arrays, such as solder bumps 444 and 446. Similarly, the circuit board 424 may be connected to the die 416 via a plurality of solder bump-arrays, such as solder bumps 448, 450, 452, and 454. The detector tile 414 and the circuit board 424 also may be connected by one or more vias extending through the die 416. For example, vias 456 and 458 may extend through the die 416 between the solder bumps 444 and 448 and the solder bumps 446 and 452, respectively. If the primary circuit board 430 is also provided in the detector assembly, then the circuit board 424 may be connected to the primary circuit board 430 by one or more solder bump-arrays, such as solder bumps 460, 462, 464, and 466. Again, vias may extend through the circuit board 424 to provide interconnections with the die 416 and the detector tile 414. For example, vias 468 and 470 may extend through the circuit board 424 to provide interconnectivity with the die 416 and the primary circuit board 430. Vias 472 and 474 also may be provided to provide interconnectivity with the die 416. These various solder bumps and vias may be used for power, control, imaging detector pixels, and any other desired connection. As discussed above, the intermediate connections provide a more tightly packed tile configuration. However, the present technique also may use a variety of edge connections.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The invention claimed is:

1. A method for assembling tile detectors for an imaging system, comprising the acts of:
   bending a flexible panel to a curved shape;
   coupling a plurality of detector tiles to the flexible panel in the curved shape, wherein the act of coupling the plurality of detector tiles comprises the act of adhering ionizing photon detector tiles to the flexible panel in a tiled configuration; and
   inversely bending the flexible panel to a desired shape to close gaps between the detector tiles.

2. The method of claim 1, wherein the act of bending the flexible panel comprises the act of applying a fluid pressure to at least one side of the flexible panel.

3. The method of claim 1, wherein the act of bending the flexible panel comprises the act of applying a gas pressure to at least one side of the flexible panel.

4. The method of claim 1, wherein the act of bending the flexible panel comprises the act of applying a curved solid to at least one side of the flexible panel.

5. The method of claim 1, wherein the act of bending the flexible panel comprises the act of supporting the flexible panel with a frame structure.

6. The method of claim 1, comprising the act of interconnecting different detector layers using soldering materials having different melting temperatures.

7. The method of claim 1, wherein the act of adhering ionizing photon detector tiles comprises the act of providing a Cadmium-Zinc-Telluride-based detector tile.

8. The method of claim 1, wherein the act of adhering ionizing photon detector tiles comprises the act of providing a Cadmium-Telluride-based detector tile.

9. The method of claim 1, wherein the act of coupling the plurality of detector tiles comprises the act of picking and placing each of the detector tiles onto the flexible panel in an edge-to-edge configuration having an undesirable gap between edges of one or more adjacent pairs of the detector tiles.

10. The method of claim 1, wherein the act of inversely bending the flexible panel comprises the act of releasing a bending force applied to the flexible panel.

11. The method of claim 1, wherein the act of inversely bending the flexible panel comprises the act of relaxing the flexible panel to a flat shape.

12. The method of claim 1, wherein the act of inversely bending the flexible panel comprises the act of partially relaxing the flexible panel to the desired shape, which has a relatively flatter curvature than the curved shape.

13. The method of claim 1, comprising the act of attaching the plurality of detector tiles to a circuit board to form a multi-detector module.

14. The method of claim 13, comprising the act of tiling a plurality of the multi-detector modules to a primary circuit board for the imaging system.

15. A method for assembling tile detectors for an imaging system, comprising the acts of:
   bending a flexible panel to a curved shape;
   coupling a plurality of detector tiles to the flexible panel in the curved shape;
   inversely bending the flexible panel to a desired shape to close gaps between the detector tiles; and
   providing each of the detector tiles as an ionizing photon detector tile intercoupled with a semiconductor wafer by intermediate connections.

16. The method of claim 15, comprising the act of forming the intermediate connections using a plurality of solder bumps.

17. A method for assembling tile detectors for an imaging system, comprising the acts of:
   forming a flexible panel comprising:
      depositing a flexible material onto a wafer; and
      removing an interior portion of the wafer to form a frame;
   bending the flexible panel to a curved shape;
   coupling a plurality of detector tiles to the flexible panel in the curved shape; and
   inversely bending the flexible panel to a desired shape to close gaps between the detector tiles.

* * * * *